United States Patent [19]

Kimura et al.

[11] Patent Number: 5,079,551
[45] Date of Patent: Jan. 7, 1992

[54] ΔΣ DIGITAL-TO-ANALOG CONVERTER WITH BIT GROUPING BY SIGNIFICANCE FOR REDUCING FEEDBACK COMPUTATION TIME

[75] Inventors: Shigenobu Kimura; Masamitsu Yamamura, both of Hamamatsu, Japan

[73] Assignee: Yamaha Corporation, Hamamatsu, Japan

[21] Appl. No.: 550,517

[22] Filed: Jul. 10, 1990

[30] Foreign Application Priority Data

Jul. 14, 1989 [JP] Japan .................................. 1-181847

[51] Int. Cl.$^5$ ............................................. H03M 3/02
[52] U.S. Cl. ..................................... 341/143; 341/144; 375/28
[58] Field of Search ................. 341/143, 144, 152, 76, 341/77; 325/27, 28, 29, 30, 33

[56] References Cited

U.S. PATENT DOCUMENTS

| 4,301,446 | 11/1981 | Petit | 341/143 |
|---|---|---|---|
| 4,467,316 | 8/1984 | Musmann et al. | 341/144 |
| 4,580,128 | 4/1986 | Ogita et al. | 341/144 |
| 4,588,981 | 5/1986 | Senn | 341/143 |
| 4,593,271 | 6/1986 | Candy | 341/144 X |
| 4,652,858 | 3/1987 | Kokubo et al. | 341/144 |
| 4,733,219 | 3/1988 | Reusens et al. | 341/144 X |
| 4,901,077 | 2/1990 | Christopher | 341/143 |

FOREIGN PATENT DOCUMENTS 2804915 8/1978 Fed. Rep. of Germany ........ 375/28

Primary Examiner—Howard L. Williams
Attorney, Agent, or Firm—Spensley Horn Jubas & Lubitz

[57] ABSTRACT

A ΔΣ modulation type 1-bit digital-to-analog conversion circuit includes an addition circuit for adding feedback digital data to input multi-bit digital data to provide results of addition, an integration circuit for integrating the results of addition provided by the addition circuit, a quantizer for quantizing output of the integration circuit to provide 1-bit digital data, and a circuit for providing analog data corresponding to the input multi-bit digital data on the basis of the 1-bit digital data. A bit of a predetermined order and bits of orders lower than the predetermined order in the feedback data are respectively made zero and bits of orders higher than the predetermined order only in the feedback data are added by the addition circuit. By feeding back only high order bits of feedback data for addition, the feedback addition is simplified and computation time thereby is shortened.

7 Claims, 2 Drawing Sheets

ΔΣ DIGITAL-TO-ANALOG CONVERTER WITH BIT GROUPING BY SIGNIFICANCE FOR REDUCING FEEDBACK COMPUTATION TIME

BACKGROUND OF THE INVENTION

This invention relates to a ΔΣ modulation (Delta Sigma modulation) type 1-bit digital-to-analog conversion circuit and a method of the same type having a simplified feedback data computation function and thereby achieving reduction in the computation time.

A 1-bit digital-to-analog conversion circuit (hereinafter abbreviated as "1-bit DAC") converts multibit (e.g., 16-bit) digital data to analog data after requantizing the digital data into 1-bit digital data and thereby attempts, theoretically, to eliminate a zero-cross distortion and a non-linear distortion in the digital-to-analog conversion operation.

In the past, 1-bit DAC has been realized as a Δ modulation (Delta modulation) type 1-bit DAC. In this type of 1-bit DAC, a value obtained by accumulating past data is applied by negative feedback to the input and compared with an input signal. In a case where an input signal is larger than the feedback signal (i.e., difference is a positive value), the output of a 1-bit quantizer which constitutes a comparator becomes "1", whereas in a case where an input signal is smaller than the feedback signal (i.e., difference is a negative value), the output of the 1-bit quantizer becomes "0". The feedback data which is to be compared with next input data increases when the output of the 1-bit quantizer is "1" and it decreases when the output of the 1-bit quantizer is "0". The 1-bit quantizer thereby produces a 1-bit signal corresponding to the difference in the input data and analog data corresponding to input digital data can be obtained by integrating the 1-bit signal by an integrator.

The Δ modulation type 1-bit DAC is simple in its structure but has the disadvantage that a quantizing noise occuring due to requantizing of a 1-bit signal is a white noise which is flat throughout all frequencies with the result that S/N in the audio frequency is deteriorated.

For overcoming this disadvantage, a ΔΣ modulation type (also called a "noise-shaping" type) 1-bit DAC has been developed as a system according to which a quantizing noise in low frequencies is shifted to high frequencies and S/N in the audio frequency thereby is improved. According to this noise shaping technique, low frequency boosting is made before quantizing of data and low frequency cutting is made after quantizing of the data whereby a quantizing noise in low frequencies is reduced without changing the frequency-response characteristic of the data.

The basic structure of a secondary ΔΣ modulation type 1-bit DAC is shown in FIG. 2. An input multi-bit (e.g., 16-bit) digital signal X is applied to an adder 11 which produces a difference signal representing a difference between the input signal X and a signal obtained by delaying an output of a 1-bit quantizer 10 by a 1-sample delay circuit 16. This difference signal is integrated by a first integration circuit 20 which is composed of an adder 12 and a 1-sample delay circuit 18.

The output of the first integration circuit 20 is applied to an adder 13 which produces a difference signal representing a difference between the output of the first integration circuit and the output of the 1-sample delay circuit 16. This difference signal is integrated by a second integration circuit 28 which is composed of an adder 14 and a delay circuit 26.

The output of the second integration circuit 28 is applied to a 1-bit quantizer 10. This 1-bit quantizer 10 consists of a zero-cross comparator and produces binary outputs (i.e., either a positive maximum value or a negative maximum value is provided.) in accordance with the polarity of the output of the second integration circuit 28. This output of the 1-bit quantizer 10 constitutes a 1-bit quantizing output Y.

It is a condition for working of the secondary ΔΣ type 1-bit DAC shown in FIG. 2 that the entire processings of the adders 11 to 14 must be completed within 1 output sample time of the output Y.

In additions in the adders 11 to 14, however, processing of higher order bits cannot be made unless presence or absence of carry from lower order bits is known and, accordingly, each of these additions requires a processing time corresponding to the number of bits of the data. In a 16-bit 2's complement code used in digital audio systems such as the Compact Disc Digital Audio System (CD) and digital audio tape recorders (DAT), for example, an input signal consists of 16 bit data and a feedback signal consists of 16 bit data with its positive maximum value being 0111 1111 1111 1111

(i.e., 7FFF $_H$ in hexadecimal notation) and its negative maximum value being 1000 0000 0000 0001

(i.e., 8001 $_H$ in hexadecimal notation).

A single addition in the prior art 1-bit DAC, therefore, requires a processing time which is sixteen times as long as that for completing one arithmetic operation for one of 16 bit code. Moreover, since the adders 11 to 14 are serially connected, a processing time which is four times as long as that for a single addition, i.e., sixty-four times as long as that for completing one arithmetic operation as a whole, is required. Accordingly, if the bit number of data is increased (e.g., 20 bits) or the sampling frequency is increased (e.g., over 10 MHz), it will become extremely difficult to complete all of the additions in the adders 11 to 14 within 1 output sample time of the output Y.

It is, therefore, an object of the invention to provide a 1-bit DAC which is simplified in its computation of feedback data to shorten time required for computation of the feedback data and thereby is capable of coping with increase in the bit number of input data or increase in the sampling frequency.

SUMMARY OF THE INVENTION

For achieving the above described object of the invention, the digital-to-analog conversion circuit according to the invention comprises input means for inputting multi-bit digital data, addition means for adding digital feedback data to the input multi-bit digital data to provide results of addition, integration means for integrating the results of addition provided by the addition means, quantizing means for quantizing output of the integration means to provide 1-bit digital data, the feedback data being supplied, with its polarity being inverted, to the addition means through delay means in response to the output of the quantizing means, and means for providing analog data corresponding to the input multi-bit digital data on the basis of the 1-bit digital data, a bit of a predetermined order and bits of orders lower than the predetermined order in the feedback data being respectively made zero and bits of orders higher than the predetermined order only in the feedback data being added by the addition means.

According to the invention, a bit of a predetermined order and bits of orders lower than the predetermined order in the feedback data are respectively made zero and bits of orders higher than the predetermined order only are added by the addition means. Accordingly, additions of the feedback data is remarkably simplified and time required for computation of the feedback data thereby is shortened. This enables the 1-bit DAC to sufficiently cope with increase in the bit number of input data or increase in the sampling frequency and also contributes to simplification in the structure of the 1-bit DAC.

A preferred embodiment of the invention will now be described with reference to the accompanying drawings.

BRIEF DESCRIPTION OF THE DRAWINGS

In the accompanying drawings.

DESCRIPTION OF A PREFERRED EMBODIMENT

Figure 1:
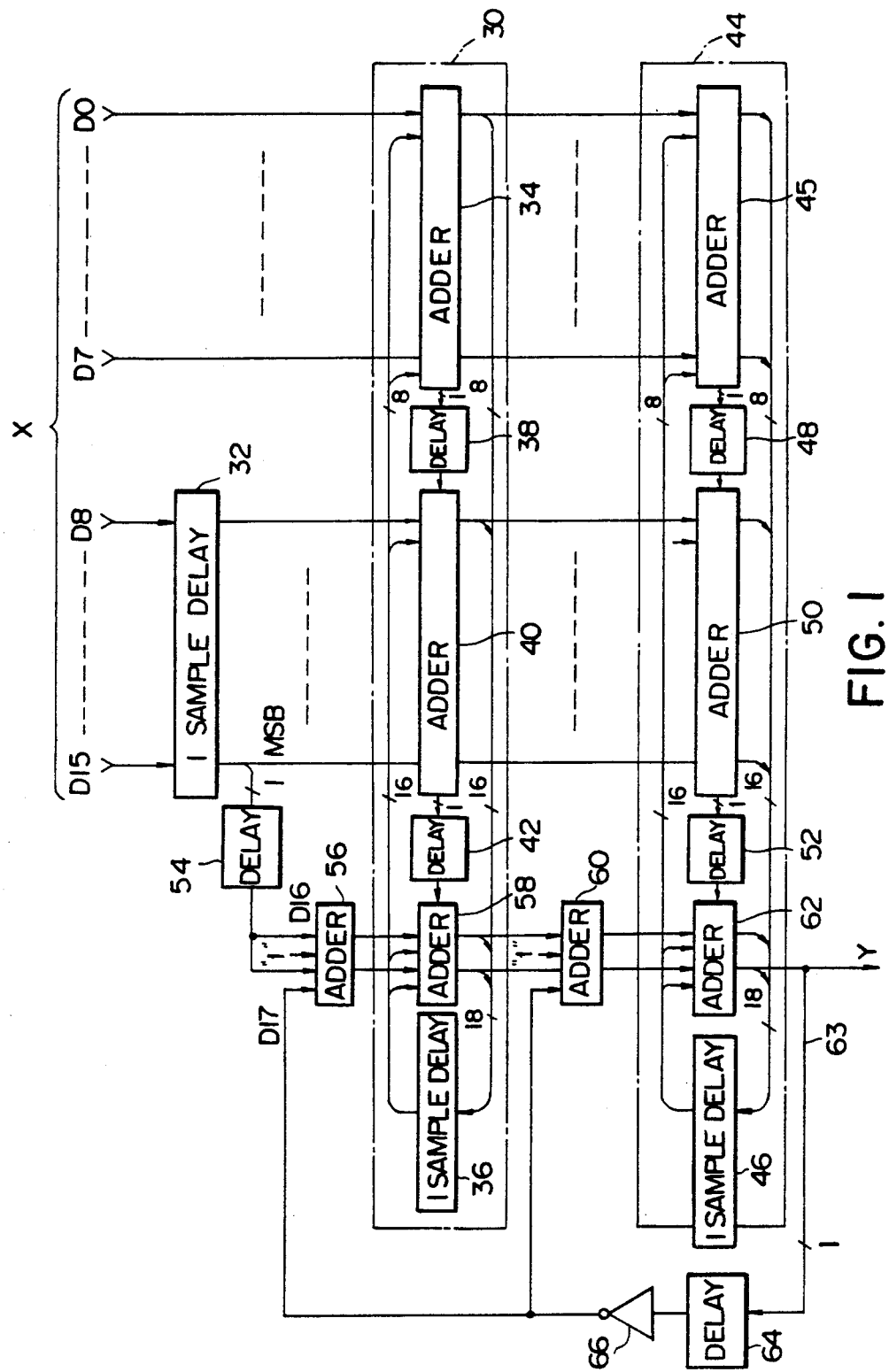
FIG. 1 is a block diagram showing an embodiment of the 1-bit DAC according to the invention.

An embodiment of the invention is shown in FIG. 1. In this embodiment, the digital-to-analog conversion circuit is constructed as a secondary $\Delta\Sigma$ modulation type 1-bit DAC and the 16-bit 2's complement code is used for input data.

In this embodiment, feedback signals are formed as follows: A positive feedback signal:

01 0000 0000 0000 0000

($10000_H$ in hexadecimal notation)
A negative feedback signal:

11 0000 0000 0000 0000

($30000_H$ in hexadecimal notation)

Since all bits are 0 except for the MSB (most significant bit) and next high order bit in these feedback signals, these lower order bits which are 0 are unnecessary for the feedback computation. Accordingly, the 2 high order bits only are fed back thereby to simplify the feedback computation and shorten the computation time.

Figure 2:
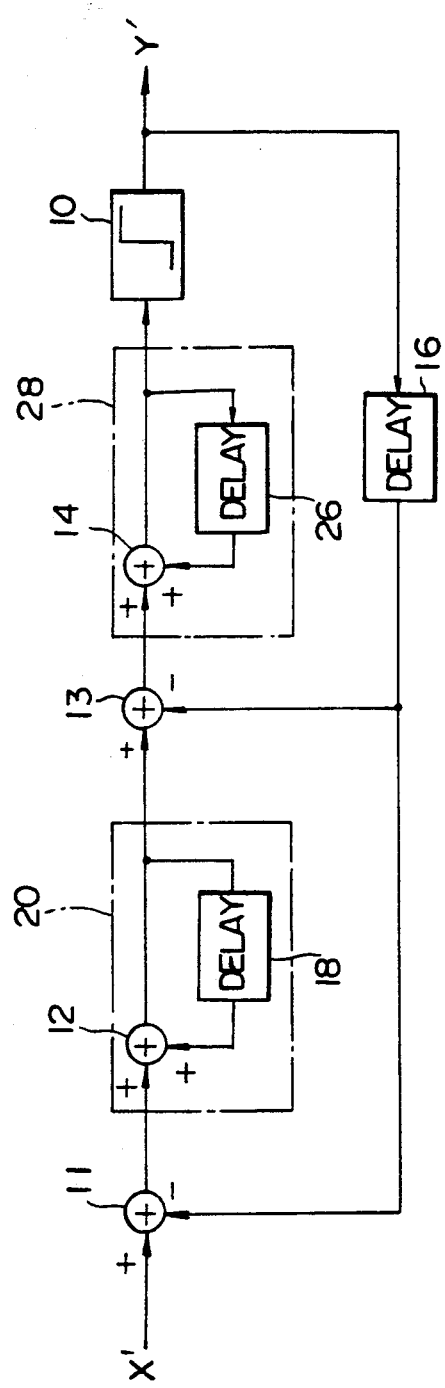
FIG. 2 is a block diagram showing the basic structure of a prior art secondary $\Delta\Sigma$ modulation type 1-bit DAC.

The circuit of FIG. 1 includes integration circuits 30 and 44 (corresponding to the integration circuits 20 and 28 in the circuit of FIG. 2) for integrating input data X' twice and adders 56 and 60 (corresponding to the adders 11 and 13 in FIG. 2) for the feedback computation.

In the 2's complement code, the MSB represents the sign bit, i.e., the polarity of the data so that, by providing the MSB as a 1-bit quantizing output Y', an independently provided 1-bit quantizer such as the one in the circuit of FIG. 2 (designated by the reference numeral 10 in FIG. 2) is unnecessary in this embodiment.

The integration circuits 30 and 44 respectively process 16-bit data in two divided groups of high order bits (D8 to D15) and low order bits (D0 to D7). More specifically, addition of the low order bits is made first by the adder 34 and thereafter by the adder 45 and addition of the high order bits is made first by the adder 40 and thereafter by the adder 50. The addition of the high order bits and the addition of the low order bits are performed in parallel to each other. Besides, computation of feedback bits (D16, D17) is made also in parallel to these additions so that total of 3 system clocks is necessary for completing processings of 1 sample data.

In FIG. 1, 16-bit parallel input data X' is applied at a sampling frequency which is the same as the system clock (e.g., 16.9344 MHz) in appearance. Therefore, in the case of CD data, for example, which has a sampling frequency of 44.1 kHz, the same data is used 384 times or an oversampling filter for interpolation is used in the former stage of the 1-bit DAC in applying the data to the 1-bit DAC.

The input data X' is divided into the two groups each having 8 bits and the group of the low order bits (D7, D6, ..., D0) is applied directly to the first integration circuit 30 whereas the group of the high order bits (D15, D14, ..., D8) is delayed by 1 output sample by a delay circuit 32 and then applied to the first integration circuit 30. This is an arrangement adopted for performing the addition of 16 bits over 2 system clocks because the addition of 16 bits cannot be completed in 1 system clock.

In the integration circuit 30, the adder 34 adds data of the low order bits D7, D6, ..., D0 of the input data X' and data obtained by delaying low order bit data (preceding output of the adder 34) by 1 output sample (i.e., 1 sample of the output Y') by a 1-sample delay circuit 36 and thereupon produces a carry signal of the most significant bit of this low order bit group. This carry signal is delayed by 1 output sample by a 1-sample delay circuit 38.

The adder 40 adds data of the high order bits D15, D14, ..., D8 of the input data X', data obtained by delaying high order bit data (preceding output of the adder 40) by 1 output sample by a 1-sample delay circuit 36 and the carry signal of the low order bit group provided by the 1-sample delay circuit 38 together and thereupon produces a carry signal from the most significant bit of the high order bit group. This carry signal is delayed by 1 output sample by a 1-sample delay circuit 42.

The output of the integration circuit 30 is applied to the second integration circuit 44. In the integration circuit 44, the adder 45 adds data of the low order bits D7, D6, ..., D0 of the output from the integration circuit 30 and data obtained by delaying low order bit data (preceding output of the adder 45) by 1 output sample by a 1-sample delay circuit 46 and thereupon produces a carry signal of the most significant bit of the lower order bit group. This carry signal is delayed by 1 output sample by a 1-sample delay circuit 48.

An adder 50 adds data of the high order bits D15, D14, ..., D8 of the output from the integration circuit 30, data obtained by delaying high order bit data (preceding output of the adder 50) by 1 output sample by a 1-sample delay circuit 46 and the carry signal of the low order bit group provided by the 1-sample delay circuit 48 together and thereupon produces a carry signal from the most significant bit of the high order bit group. This carry signal is delayed by 1 output sample by a 1-sample delay circuit 52.

The most significant bit data MSB of the input data X is delayed by a total of 2 output samples by the 1-sample delay circuits 32 and 54 and thereafter is applied to an adder 56. This adder 56 adds the feedback signal "01" or "11" and data D16, D17 which are obtained by converting the most significant bit data MSB of the input data X provided by the 1-sample delay circuit 54 to 2-bit data (i.e., by converting "0" to "00" or "1" to "11"). Since the low order bit of the 2-bit feedback signal is "1" commonly to "01" and "11", "1" is permanently applied to the low order bit of the adders 56 and 60.

The adder 58 adds the 2-bit output data of the adder 56, data obtained by delaying data (preceding output of the adder 58) by 1 output sample by the 1-sample delay circuit 36 and the carry signal provided by the 1-sample delay circuit 42 together.

The adder 60 adds the data D17 and the 2-bit output data of the adder 58 ("01" or "11") together.

An adder 62 adds the output data of the adder 60, data obtained by delaying data (preceding output of the adder 62) by 1 output sample by the 1-sample delay circuit 46 and the carry signal provided by the 1-sample delay circuit 52 together. The high order bit of the 2-bit output of this adder 62 is provided as the quantizing output Y'. The 1-bit data of this quantizing output Y is also delayed by 1 output sample by a 1-sample delay circuit 64 of a feedback circuit 63, inverted by an inverter 66 of the feedback circuit 63 and thereafter is applied to the adders 56 and 60 as the high order bit data of the 2-bit feedback signal.

In sum, according to the embodiment of FIG. 1, the 16-bit input data X' is divided into the high order bit group and the low order bit group and the data of the high order bit group is applied to the first integration circuit 30 after being delayed by 1 output sample by the 1-sample delay circuit 32. As a result, the addition of the low order bit group is made prior to the addition of the high order bit group by 1 output sample in the integration circuit 30 and the carry signal of the low order bit group is used for the addition of the high order bit group.

The results of the processings in the integration circuit 30 are applied to the second integration circuit 44 and addition is made respectively for the high order bit group and the low order bit group.

The adders 56, 58, 60 and 62 sequentially perform 2-bit addition of the MSB of input data, the carry signals in the integration circuits 30 and 44 and the feedback signal and the high order bit of the final result of additions provided by the adder 62 is provided as the 1-bit DAC output Y. A signal obtained by inverting this output Y by the inverter 66 is fed back to the adders 56 and 60 as the high order bit data of the 2-bit feedback signal. The low order bit data of the feedback signal which is constantly "1" is applied permanently to the adders 56 and 60.

According to the above described operation, input data to the integration circuit 30 and 40 is divided into the high order bit group and the low order bit group due to limitation in the processing time. Since the addition of the low order bit group is made prior to the addition of the high order bit group by 1 output sample, the carry signal from the low order bit group has already been obtained when the addition of the high order bit group is made so that no difficulty arises in the additions in these divided groups. It suffices if the computation of 8 bits has been completed in 1 system clock.

Since the feedback signal is 2-bit data, it suffices in the additions by the adders 56, 58, 60 and 62 if the 2-bit addition is completed four times in 1 system clock.

In the above described embodiment, the feedback data is made $10000_H$ and $30000_H$. The feedback data may also be:

A positive feedback signal 0 1000 0000 0000 0000

($08000_H$ in hexadecimal notation)

A negative feedback signal 1 1000 0000 0000 0000

($18000_H$ in hexadecimal notation)

The feedback data may also be set at other values having regard to S/N and the $\Delta\Sigma$ operation in the output Y.

The digital-to-analog conversion circuit method according to the invention may be constructed not only by a hardware logic but also by a software program such as one used for an ordinary digital signal processing computation.

Figure 3:
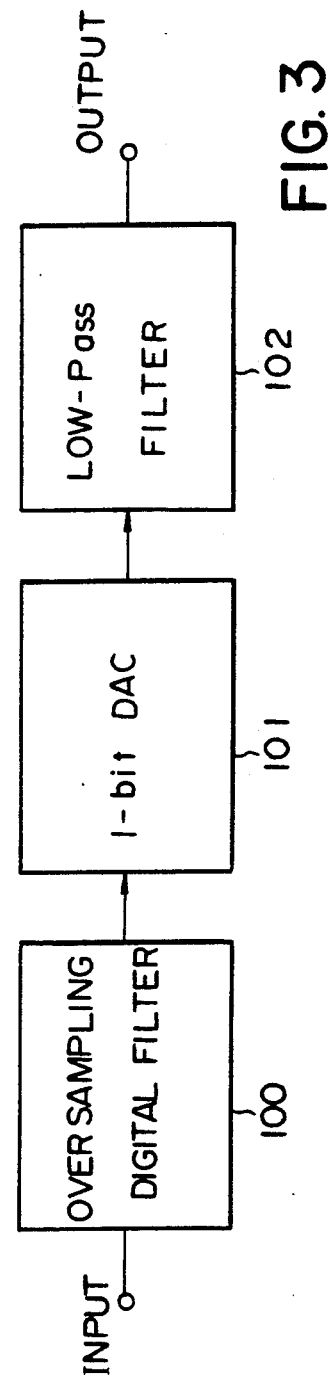
FIG. 3 is a block diagram showing a basic construction for normally using the 1-bit DAC shown in FIGS. 1 and 2.

FIG. 3 shows a basic construction for using the 1 bit DAC shown in FIGS. 1 and 2. In this construction, PCM (pulse code modulation) data is input in devices such as a CD player and a DAT. The input PCM data is converted to high bit data and oversampled by an oversampling digital filter 100 and its output data is applied to a 1-bit DAC 101 where the above described operations are performed to provide 1-bit digital data of a PDM wave or a PWM wave. Accordingly, by passing this 1-bit data through an analog low-pass filter 102 of a low order, an analog signal output corresponding to the PCM data can be obtained. The foregoing description has been made about the secondary $\Delta\Sigma$ modulation type digital-to-analog conversion circuit. The invention is of course applicable to a digital-to-analog conversion circuit of a primary $\Delta\Sigma$ modulation type or a tertiary or higher order of $\Delta\Sigma$ modulation type.

What is claimed is:

1. A digital-to-analog conversion circuit comprising:
input means for inputting multi-bit digital data;
addition means for adding digital feedback data to the input multi-bit digital data to provide results of addition;
integration means for integrating the results of addition provided by the addition means to produce an integration output by adding the results of addition supplied from said addition means and feedback data for integration purposes obtained by delaying the results of addition by one sample;
quantizing means for quantizing the integration output to provide 1-bit digital data; and
means for providing analog data corresponding to the input multi-bit digital data on the basis of the 1-bit digital data;
a bit of a predetermined order and bits of orders lower than the predetermined order in the feedback data being respectively ignored and bits of orders higher than the predetermined order only in the feedback data being added by the addition means;
the multi-bit input data being divided into a high order bit group and a low order bit group and said integration means comprising first addition means for adding data of the low order bit group and producing a carry signal and second addition means for adding data of the high order bit group and the received carry signal from said first addition means; and said digital-to-analog conversion circuit further comprising first delay means for delaying the data of the high order bit group of the multi-bit input data before being applied to said second addition means of said integration means and second delay means for delaying the carry signal from the first addition means before the carry signal is supplied to the second addition means.

2. A digital-to-analog conversion circuit as defined in claim 1 wherein said multi-bit data and feedback data are respectively 2's complement data.

3. A digital-to-analog conversion circuit as defined in claim 1 wherein said feedback data consist of 2-bit data whose low order bit is constantly "1" and said low order bit data is permanently applied to said addition means.

4. A digital-to-analog conversion circuit as defined in claim 1 wherein said means for providing analog data is an analog low-pass filter.

5. A digital-to-analog conversion circuit as defined in claim 4 further comprising an oversampling digital filter for supplying the data-interpolated multi-bit digital data to the input means.

6. A digital-to-analog conversion circuit comprising:
input means for inputting multi-bit digital data;
addition means for adding digital feedback data to the input multi-bit digital data to provide results of addition;
integration means for integrating the results of addition provided by the addition means to produce an integration output by adding the results of addition supplied from said addition means and feedback data for integration purposes obtained by delaying the results of addition by one sample,
quantizing means for quantizing the integration output to provide 1-bit digital data;
means for providing output analog data corresponding to the input multi-bit digital data in response to the output of the quantizing means;
feedback means for feeding back the feedback data to the addition means in response to the output of the quantizing means,
said feedback data being of a bit number smaller than the bit number of the input multi-bit digital data and including data having influence over the polarity of the results of addition in the addition by the addition means;

the multi-bit input data being divided into a high order bit group and a low order bit group and said integration means comprising first addition means for adding data of the low order bit group and producing a carry signal and second addition means for adding data of the high order bit group and the received carry signal from said first addition means; and first delay means for delaying the data of the high order bit group of the multi-bit input data before being applied to said second addition means of said integration means and second delay means for delaying the carry signal from the first addition means before the carry signal is supplied to the second addition means.

7. A method of digital-to-analog conversion comprising the steps of:
inputting multi-bit digital data;
adding digital feedback data to the input multi-bit digital data to provide results of addition;
integrating the results of addition to produce an integration output by adding the results of addition and the feedback data for integration purposes obtained by delaying the results of addition by one sample together;
quantizing the integration output to provide 1-bit digital data;
the feedback data being added, with its polarity being inverted, to the input multi-bit digital data after being delayed in response to the result of quantizing;
providing analog data corresponding to the input multi-bit digital data on the basis of the 1-bit digital data;
a bit of a predetermined order and bits of orders lower than the predetermined order in the feedback data being respectively ignored and bits of orders higher than the predetermined order only in the feedback data being added in the addition with the input multi-bit digital data;
the multi-bit input data being divided into a high order bit group and a low order bit group and the step of integrating comprising the steps of carrying out a first addition in which data of the low order bit group is added to produce a carry signal, carrying out a second addition in which data of the high order bit group is added together with the received carry signal from the first addition, delaying the data of the high order bit group of the multi-bit input data before carrying out the second addition, and delaying the carry signal from the first addition before adding it in the second addition.

* * * * *